United States Patent
Canaperi et al.

(10) Patent No.: US 6,475,072 B1
(45) Date of Patent: Nov. 5, 2002

(54) METHOD OF WAFER SMOOTHING FOR BONDING USING CHEMO-MECHANICAL POLISHING (CMP)

(75) Inventors: Donald F. Canaperi, Bridgewater, CT (US); Jack Oon Chu, Manhasset Hills, NY (US); Guy M. Cohen, Mohegan Lake, NY (US); Lijuan Huang, Mountain View, CA (US); John Albrecht Ott, Greenwood Lake, NY (US); Michael F. Lofaro, Marlboro, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/675,841

(22) Filed: Sep. 29, 2000

(51) Int. Cl.⁷ ................................................. B24B 1/00
(52) U.S. Cl. ........................................ 451/65; 451/285
(58) Field of Search .................... 451/65, 41, 285–289, 451/388; 437/24, 26

(56) References Cited

U.S. PATENT DOCUMENTS

| 5,374,564 A | * | 12/1994 | Bruel .......................... 437/24 |
| 5,762,539 A | * | 6/1998 | Nakashiba et al. ..... 451/285 X |
| 5,820,448 A | * | 10/1998 | Shamouilian et al. ... 451/285 X |
| 5,823,854 A | * | 10/1998 | Chen ....................... 451/285 X |
| 5,934,980 A | * | 8/1999 | Koos et al. .............. 451/287 X |
| 5,941,758 A | * | 8/1999 | Mack ...................... 451/285 X |
| 5,997,392 A | * | 12/1999 | Chamberlin et al. .... 451/287 X |
| 6,090,689 A | * | 7/2000 | Sadana et al. .............. 438/480 |
| 6,107,653 A | * | 8/2000 | Fitzgerald ................... 257/191 |

* cited by examiner

*Primary Examiner*—Joseph J. Hail, III
*Assistant Examiner*—Anthony Ojini
(74) *Attorney, Agent, or Firm*—Scully, Scott, Murphy & Presser; Robert M. Trepp, Esq.

(57) ABSTRACT

A method and apparatus is described incorporating a semiconductor substrate, a CMP tool, a brush cleaning tool, and a chemical wafer cleaning tool. The CMP is performed with a down force of 1 psi, a backside air pressure of 0.5 psi, a platen speed of 50 rpm, a crarrier speed of 30 rpm and a slurry flow rate of 140 milliliters per minute.

16 Claims, 5 Drawing Sheets

METHOD OF WAFER SMOOTHING FOR BONDING USING CHEMO-MECHANICAL POLISHING (CMP)

FIELD OF THE INVENTION

This invention generally relates to a method and an apparatus for performing wafer to wafer bonding of different semiconductor materials and more specifically, relates to a method and an apparatus for smoothing the wafer surface to a roughness of less than 9 Angstroms root mean square (RMS) over a 20 microns dimensionality across the wafer. Preferably, this method provides for polishing of a wafer to achieve the desired smoothness while reserving the overall wafer flatness across the wafer to achieve a final smoothed surface which can be chemically cleaned using conventional cleaning procedures for performing wafer bonding.

BACKGROUND OF THE INVENTION

Silicon-on-Insulator (SOI) is a current technology for fabricating semiconductor devices such as field effect transistors (FETs) using a thin layer of silicon separated dielectrically from a substrate by a layer of insulating material. Devices fabricated using SOI structures exhibit greatly reduced parasitic capacitance compared with devices simply fabricated on bulk silicon. For this reason, SOI technology has become a vital and critical part of IBM's strategy to incorporate and implement into present manufacturing of CMOS technology and to become the OEM of high speed IC's on insulator. However, this strategy does depend on a cost-effective and reliable supply of SOI substrates suitable for integration into mainstream CMOS manufacturing processing.

Most of the high quality SOI substrates which are currently commercially available are produced through ion implantation of a silicon wafer to create a buried insulating layer below the surface of the silicon wafer. An example of such a SOI structure is a substrate produced by the SIMOX (Separation by Implanted OXygen) process such as described in U.S. Pat. No. 5,930,643 by D. K. Sadana et al. which issued Jul. 27, 1999 or in U.S. Pat. No. 6,090,689 by D. K. Sadana which issued Jul. 18, 2000. The applications of these SOI structures are limited in that the surface layer must be the same material as the underlying Si wafer. Also, this surface silicon layer is damaged during the high energy implantation process and typically requires a high temperature (i.e. 1000–1300 C.) annealing process to remove the implant damage. Similarly, the insulating layer in this approach is limited in that only oxide compounds of silicon can be formed by this technique and so, in practice, it is limited to forming either a silicon dioxide or silicon oxynitride buried layer. Subsequently, more complicated material structures or stacks containing layer materials other than these mentioned silicon oxides are not practical and in principle very difficult to fabricate. Furthermore, the thickness of the buried insulating layer is also limited and difficult to control using the SIMOX technique. For example, a very thin buried oxide (BOX) layer of 5 nm or a thick BOX of 1 micron is very difficult to achieve using the SIMOX approach.

Another method for fabricating SOI structures is by wafer bonding whereby two substrates are bonded together with silicon dioxide as the bonding layers. Moreover, in this approach the desired or required film or layer stack is initially deposited on the surfaces of the two separate wafers, i.e. seed and handle wafers and ultimately, these films will be used to form the buried insulating layer as well as the desired layer or layered structure for device fabrication. These two seed and handle wafers will be polished if required and then be directly bonded together using a top surface to a top surface orientation. One of the wafers, i.e. seed wafer, is then thinned down to create the SOI structure using an etch back technique or a wafer cleaning technique such as the Smart-CutÒ, SiGen or Eltran process. The Smart-CutÒ process is described in U.S. Pat. No. 5,374,564 by M. Bruel which issued Dec. 20, 1994.

In general, wafer bonding is a powerful and flexible technique for creating SOI films and other layered-stacked substrates suitable for device fabrication and yet, can still be amenable or applicable to a variety of integration schemes which provide some key advantages over ion implantation approaches. Typically, because this method involves the layer transfer of one or more films from a seed wafer to a handle substrate, there is a greater flexibility in the type and quality of the material stack that can be created or bonded to an buried insulator layer. Specifically, this method allows the transfer of semiconductor films other than silicon such as Inp, GaAs, etc. for potential mixed III–V to II–VI device integration schemes as well as other buried metal films such as W, Pt, etc. which are suitable for buried interconnects, dual gates or ground plane device applications. Understandable, such types of surface or buried structures incorporating these type of lattice-mismatched, metal or insulating layers can not be simply formed or created by the ion implant approach. Also, wafer bonding can be performed at low temperatures ranging from room temperature (23 C.) to 400 C. which will subsequently allow for multiple bonding steps to be performed on a single wafer if so desired without effecting the electrical properties of the existing devices or the integrated circuits. These advantages have made possible many new developments in the design and fabrication of novel semiconductor devices such as the Double-Gate Devices or back-plane device structures.

Smoothing or planarization of SiGe for epitaxial growth has been shown in U.S. Pat. No. 6,107,653 by E. A. Fitzgerald in an epitaxial growth application on bulk silicon. In U.S. Pat. No. 6,107,653, chemo-mechanical polishing (CMP) of the upper surface of a graded SiGe layer was performed to remove the roughness created by dislocations introduced during relaxation of the SiGe layer. The planarization of the surface was for the purpose of preventing the continued roughening and grooving of the surface that leads to dislocation blocking. Planarization prevented a rise in the threading dislocation density during subsequent growth of the graded SiGe layer. However, there is no mention of forming a bondable surface, wafer uniformity, or the roughness quantification in terms of RMS.

The key to the wafer bonding approach and its benefits is realistically based upon the ability to consistently perform and generate a high quality wafer to wafer bonding process. Critical prerequisites for performing good quality wafer bonding of two different substrates requires that the surfaces to be bonded to be extremely flat (i.e. less than 10 Angstroms) and to be completely free of any foreign particles or contaminants. Moreover, it is critical that the surface roughness be less than 9 angstroms root mean square (RMS) over a 20 microns square geometry in order to achieve a successful and high quality bonding interface between the two substrates. These restricted requirements prevent the bonding of most "as-grown" materials since their initial film topography after the growth processes is typically so much greater than the critical 9 angstroms value necessary for bonding. However, since it is possible to grow high quality thermal oxide layers with the necessary surface properties for bonding there are bonded SOI wafers which are created by directly bonding a bulk silicon wafer to a thermal oxide layer in order to form a BOX structure and are commercially available from SOITECH.

SUMMARY OF THE INVENTION

In accordance with the present invention, a method and an apparatus is provided/described for performing wafer to wafer bonding for many different materials by smoothing the wafer surface to a roughness of less than 9 angstroms root mean square (RMS) using a process of Chemical Mechanical Planarization (CMP).

This invention further provides a method and apparatus for performing wafer to wafer bonding for many materials by smoothing the wafer surface to a roughness of less than 9 Angstroms RMS over 20 microns. Moreover, smoothing of the entire wafer surface can be accomplished by the CMP process while preserving and maintaining the overall wafer flatness across the wafer. After the CMP process, the final surface can be effectively cleaned using a brush clean to remove particles and a conventional RCA or standard cleaning 1 and 2 (SC-1,-2) chemical cleaning procedure to prepare the wafer surfaces for wafer bonding. This invention has been used to smooth and successfully bond Low Temperature Oxide (LTO) layers, polysilicon layers, and silicon germanium (SiGe) layers thereby providing the capability to create and fabricate complex material stacks and devices. The ability to smooth and bond LTO films is particulary important and useful for fabricating semiconductor devices since LTO layers can be easily deposited at low temperatures over a variety of materials which initially may not be suitable for CMP polishing or be too rough for wafer bonding. Once deposited the initial roughness of the starting material will be translated over to the surface of the LTO layer which can then be readily smoothed to a high surface quality of 9 Angstroms RMS or less in roughness by this invention. It has been demonstrated that once the surface of the LTO layer is smoothed properly that the LTO layer can be use to perform strong, high quality wafer to wafer bonding to another wafer, ie. handle wafer. In this fashion, a LTO layer can be used as an intermediate buffer layer to provide the "glue" or "adhesives" to enable the bonding of a wide range of materials and devices. As a result of this invention, wafer bonding has been incorporated as an important component of new SOI based devices, including double gate devices and SiGe-On-Insulator (SGOI) device structures.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
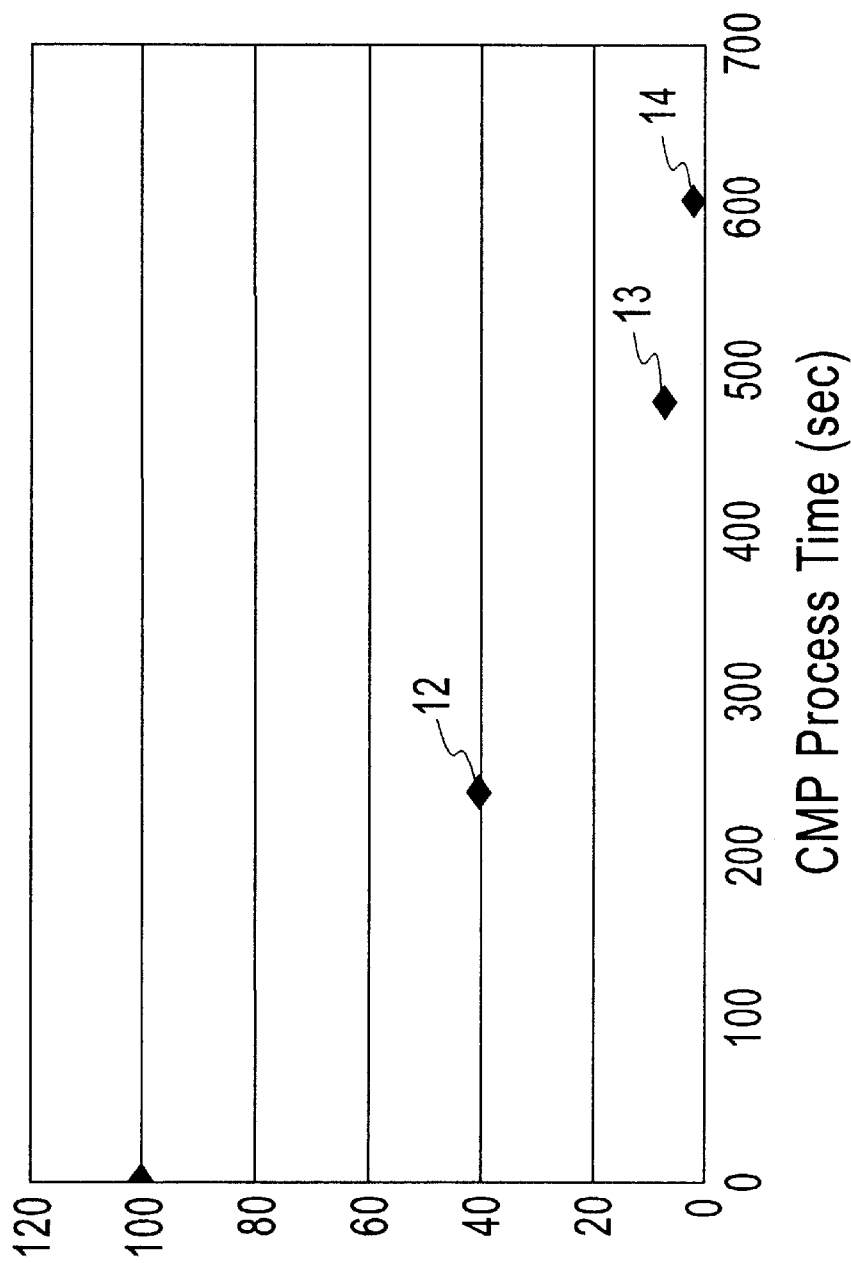
FIG. 1 is a correlation graph showing the surface roughness of a SiGe film versus the CMP polish time illustrating one embodiment of the invention.
Figure 2:
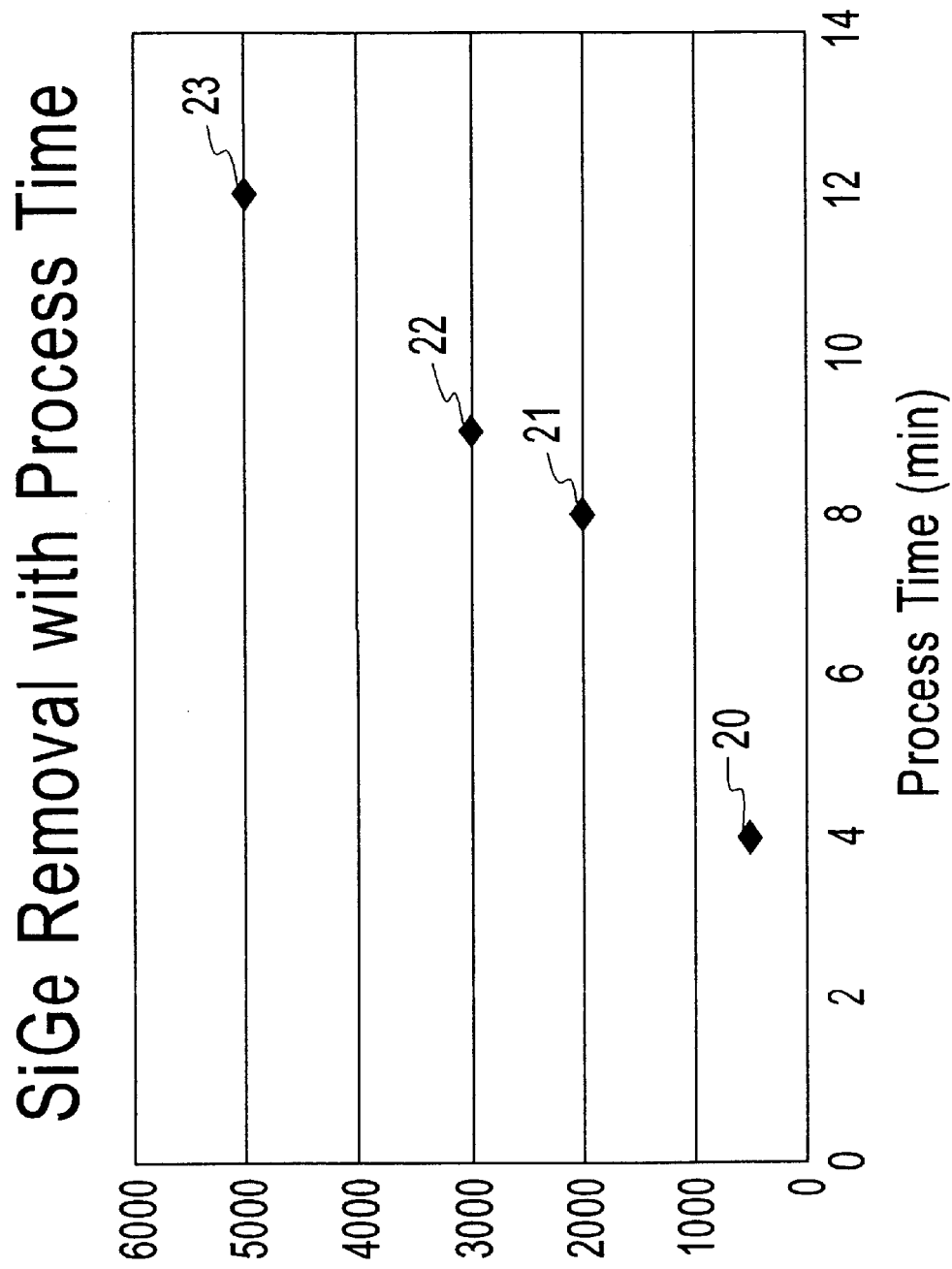
FIG. 2 is a graph showing the relationship for the removal of the SiGe material given in Angstroms versus the CMP polish time given in minutes illustrating one embodiment of the invention.

The present invention provides a method and a process apparatus for polishing an entire wafer in order to achieve a smooth, bondable wafer surface of less than 9 Angstroms RMS using a Chemical Mechanical Planarization (CMP) process applicable to wafer bonding. The use of the words "Chemical Mechanical Planarization" or the words "Chemo Mechanical Polishing" are intended to mean the same thing. Using this method, a material can be removed from the wafer surface at a removal rate ranging between 50 Angstroms per minute to 1000 Angstroms per minute depending on the type of material being planarized and smoothed. Furthermore, the surface roughness during the polishing process is progressively reduced as the material is being removed. The overall polish process time and the subsequent total material removed that is required to achieve a smooth, bondable wafer surface does depend on the inital surface roughness and the type of material being polished and smoothed. Referring to FIG. 1, as an example, the plot of data points 12–14 shows the correlation between the CMP process time and the corresponding surface roughness measurement for a strained SiGe film. In FIG. 1, the ordinate represents Surface Roughness in Angstroms RSM and the abscissa represents process time. The intial surface of the SiGe film which was measured to be 100 Angstroms RSM was significantly reduced to a bondable wafer surface of 2 Angstroms RMS after a 10 minutes of CMP process time. Moreover, FIG. 2 shows the relationship for the material removal of the SiGe film in Angstroms of thickness at data points 20–23 with respect the CMP polish time in minutes. In FIG. 2, the ordinate represents Thickness of SiGe Removed in Angstroms and the Abscissa represents process time.

For utilizing and expansion of the CMP process to bonding and forming SOI structures and semiconductor devices, reference is made to Ser. No. 09/675,840 filed on even date, Sep. 29, 2000 by D. F. Canaperi et al. entitled "Preparation of Strained Si/SiGe On Insulator by Hydrogen Induced Layer Transfer Technique" which is incorporated herein by reference.

Figure 3:
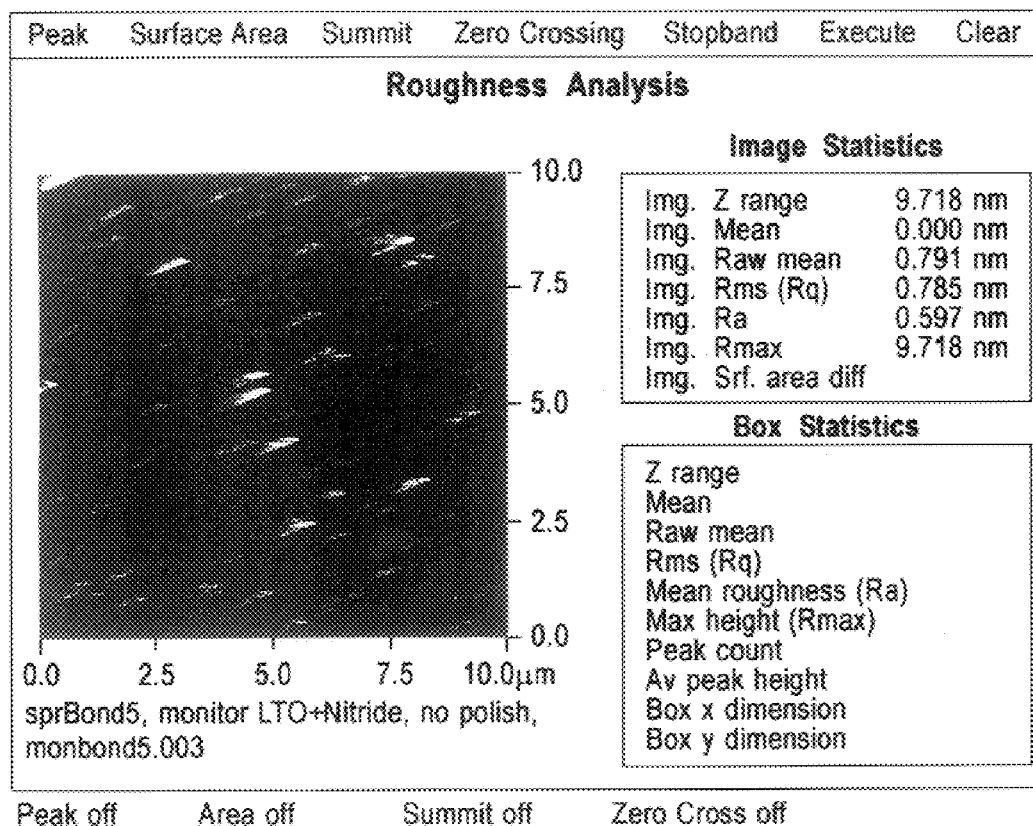
FIG. 3 is a AFM image representing the surface morphology of an as-deposited LTO film showing an initial surface roughness of 7.85 Angstroms RMS.
Figure 4:
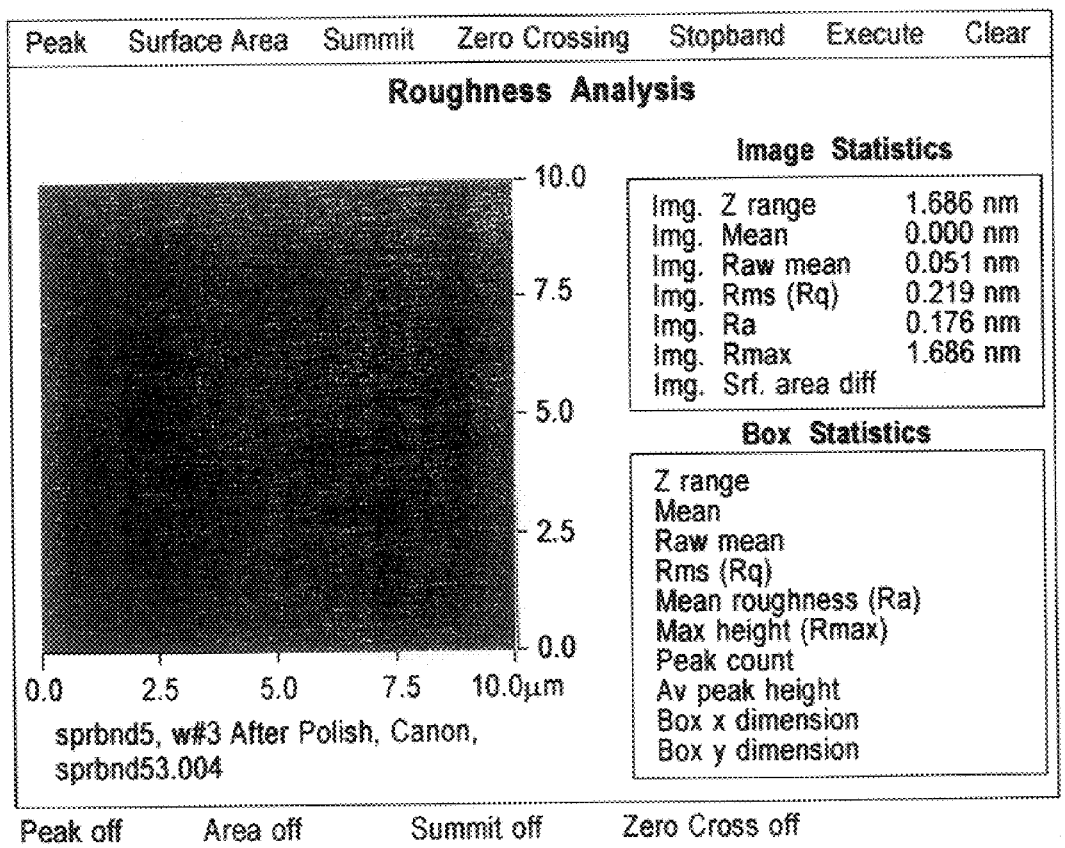
FIG. 4 is a AFM image illustrating the surface morphology of a LTO film after 2 minutes of CMP processing showing a final surface roughness of 2.19 Angstroms RMS.

In regards to the surface roughness improvement for a LTO film, FIG. 3 shows an Atomic force microscopy (AFM) image for a as-deposited LTO film having an initial surface roughness of 7.85 Angstroms RMS whereby after a 2 minutes of CMP processing period a final bondable surface roughness of 2.19 Angstroms RMS was achieved.

Figure 5:
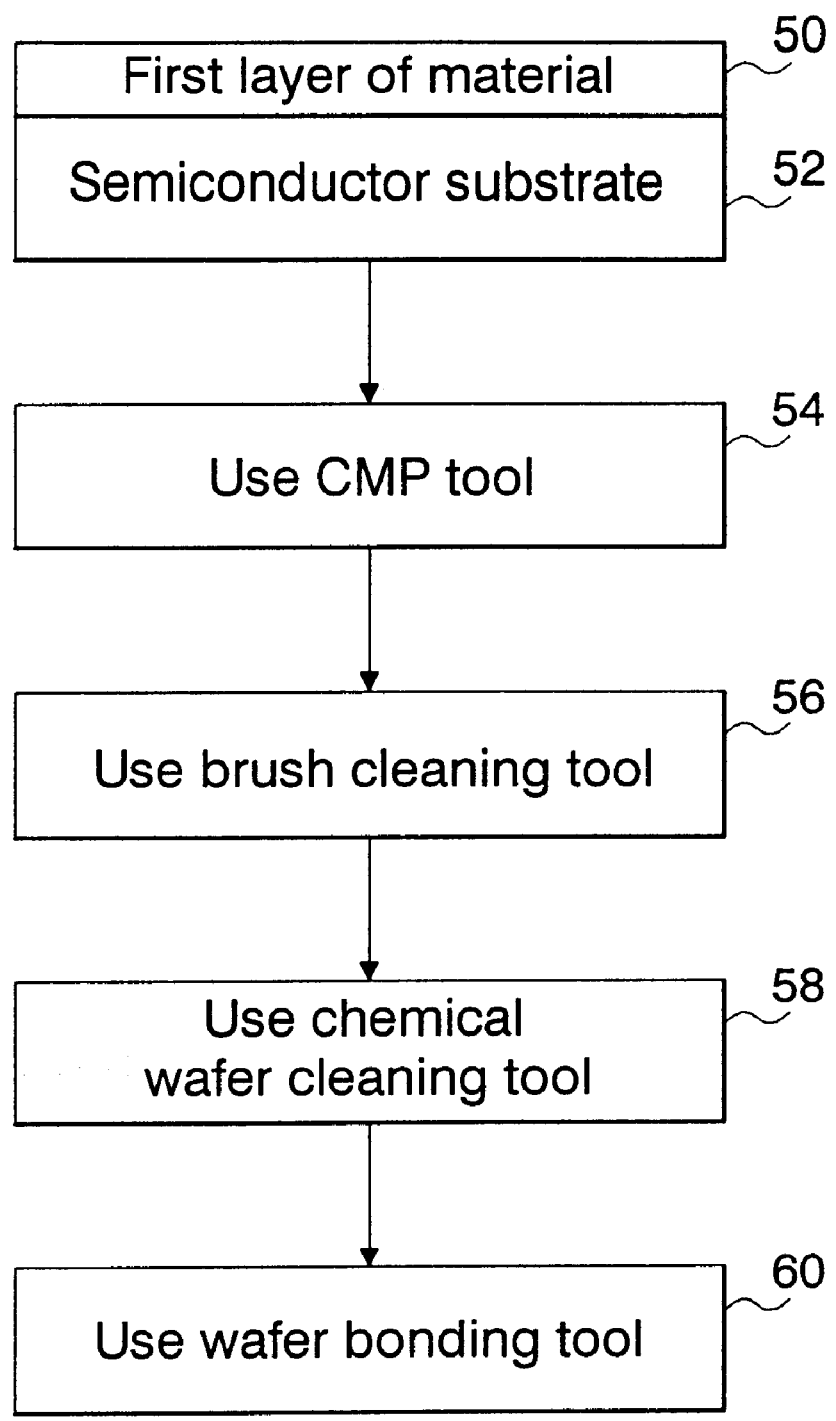
FIG. 5 illustrates the sequential steps performed pursuant to the present invention by apparatus for polishing and smoothing a wafer surface suitable for performing wafer to wafer bonding wherein a first layer of material on a semiconductor substrate is operated on by a CPM tool, a brush cleaning tool, a chemical wafer cleaning tool and a wafer bonding tool.

FIG. 5 illustrates the sequential steps performed pursuant to the present invention by apparatus for polishing and smoothing a wafer surface for performing wafer to wafer bonding wherein a first layer of material 50 on a semiconductor substrate 52 is operated on by a CPM tool at 54, a brush cleaning tool at 56, a chemical wafer cleaning tool at 58, and a wafer bonding tool at 60.

The following table 1 is a summary of the polishing improvements in terms of surface roughness observed for the different materials of LTO, PolySilicon and SiGe deposited by a variety of growth techniques after which in all cases, the resulting wafer surfaces were successfully bonded to another handle wafer.

TABLE 1

| Material | Roughness Before CMP (RMS) | Bondability | Roughness After CMP (RMS) |
| --- | --- | --- | --- |
| LTO | 25 to 40 Angstroms | Good (depending on the material under LTO layer i.e. tungsten, polysilicon) | 2 to 4 Angstroms |
| Polysilicon | 30 to 120 Angstroms | Good (depending on the film thickness and process used for growth of polysilicon) | 6 to 9 Angstroms |
| Silicon Germanium | 60 to 150 Angstroms | Good (depending on the Ge content of the film) | 4 to 7 Angstroms |

The preferred embodiment of the present invention is described as follows: (1) The CMP tool; (2) The Polishing Pad system; (3) Pad Condition; (4) The Polishing Slurry and (5) Brush Cleaning.

(1) The CMP Tool.

This invention can be practiced on any CMP tool or equipment which functions using a moving contact between a polishing "pad" or "belt" and a wafer, and further provides the use of a liquid polish slurry suspension. An example of the invention is a Westech 372 Polishing Tool, which comprises a circular rotating polishing platen and a rotating wafer carrier. The preferred embodiment for the operation of the above mentioned tool are shown in Table 2:

TABLE 2

| Downforce: | 1 PSI |
| --- | --- |
| Platen Speed: | 50 RPM |
| Carrier Speed: | 30 RMP |
| Backside Air Pressure: | 0.5 PSI |
| Slurry Flow Rate: | 140 Milliliters/minute |

(2) The Polishing Pad System.

This invention prefers and may involve the use of a two pad, stacked system for the polishing pad. The top pad, which contacts the wafer surface during polishing, is made of cast polymeric material, such as urethane, containing evenly distributed pores. The top pad is perforated through with evenly spaced holes and is placed over a second pad which serves as a subpad. Because of the perforations in the top pad, the subpad is wetted and becomes saturated with the polishing slurry which is desirable and necessary for polishing uniformity. The subpad is constructed of polyester fibre and urethane binder material. This invention has been practiced using polishing pads commercially available from Rodel Corporation, Newark, Delaware. The preferred product numbers are IC 1000 for the top pad and Suba IV for the subpad.

(3) Pad Conditioning.

The top pad is initially conditioned before polishing for 300 seconds. This can be accomplished using a fixed abrasive conditioner such as diamond. Also, prior to polishing any subsequent wafers the pad is conditioned for another 25 seconds.

(4) Polishing Slurry.

The polishing slurry is a colloidal dispersion in water of a silica abrasive. This slurry is pumped onto the polising pad surface at a flow rate in the range of 50 to 200 Millilitres per minute. The preferred specifications and properties of this slurry are shown in Table 3:

TABLE 3

| pH | 9.5 to 11.0 |
| --- | --- |
| Weight % solids | 5 to 30% |
| Particle Size | 12 to 200 nanometers |

The polishing slurry may be SC112 commercially available from Cabot Corporation, Aurora, Ill. The slurry flow rate may be 140 milliliters/minute. The polishing slurry may have a pH from about 9.5 to about 11.0. The weight % of solids, which contains silica or may be only silica, may be in the range from about 5% to about 30% (a greater range than is in SC112) and the silica particle size may be the range from about 12 to about 200 nanometers (a greater range than is in SC112).

(5) Brush Cleaning.

The CMP process step is followed by a brush cleaning step. Brush cleaning is necessary and effective in removing residual abrasive particles from the wafer surface left over from the CMP polishing process. This cleaning step is essential in order to ensure that the wafer surface is completely free of particles after the CMP polishing before any sequent wafer bonding can be performed. This invention prefers the conventional doubled-sided roller brush cleaner containing one stage of brush cleaning with the time duration of the roller brush clean step being set for 99 seconds. A wafer bonding tool is a mechanical apparatus to spin dry the wafers to be bonded, hold the wafers in alignment and to bring the surfaces of the wafers together into intimate contact.

Having thus described our invention, what we claim as new and desire to secure by Letters Patent is:

1. An apparatus for polishing and smoothing a wafer surface suitable for performing wafer to wafer bonding comprising:

a semiconductor substrate, a first layer of material formed on said substrate, a CMP tool, a brush cleaning tool, a chemical wafer cleaning tool, and a wafer bonding tool.

2. The apparatus according to claim 1, wherein said semiconductor substrate comprises a single crystalline wafer selected from the group consisting of Si, SiGe, Ge, SiC, GaAs, InP, SOS, SOI, and BESOI.

3. The apparatus according to claim 1, wherein said first layer of material comprises a single crystalline layer selected from the group consisting of Si, SiGe, Ge, SiC, SiGeC, GaAs, and InP.

4. The apparatus according to claim 1, wherein said first layer of material comprises a polycrystalline layer, selected from the group consisting of polysilicon, poly-SiGe, poly-Ge, poly-SiC, and poly-SiGeC.

5. The apparatus according to claim 1, wherein said first layer of material comprises an amorphous layer selected from the group consisting of silicon oxide, silicon dioxide, Low Temperature Oxide (LTO), high temperature thermal oxide, PECVD Oxide, PECVD TEOS, silicon nitride, and silicon-oxynitride.

6. The apparatus according to claim 1, wherein the CMP tool comprises a circular rotating polishing platen and a rotating wafer carrier.

7. An apparatus according to claim 6, wherein the CMP tool is operated with the following conditions:

a downforce of 1 psi, a platen speed of 50 rpm, a carrier speed of 30 rpm, a backside air pressure of 0.5 psi, and a slurry flow rate of 140 milliliters per minute.

8. An apparatus according to claim 6, wherein the CMP tool uses a two pad, stack system wherein the top pad is made of cast polymeric material and contains evenly distributed pores.

9. An apparatus according to claim 8, wherein the top pad is initially conditioned before polishing for 300 seconds using a fixed abrasive diamond conditioner, and also for another 25 seconds prior to the next wafer start.

10. An apparatus according to claim 8, wherein the top pad is made of cast polymeric urethane.

11. An apparatus according to claim 6, wherein the CMP tool uses a polishing slurry comprising a colloidal dispersion in water of a silica abrasive.

12. An apparatus according to claim 6, wherein the CMP tool uses a two pad, stack system where the bottom subpad is made of polyester fibre and urethane binder material.

13. An apparatus according to claim 12, wherein the polishing slurry is pumped onto the polishing pad surface at a flow rate in the range of 50 to 200 millilitres per minute.

14. An apparatus according to claim 12, wherein the polishing slurry has the following compositon and properties:

a pH in the range from 9.5 to 11.0, a weight % solids in the range from 5 to 30%, and a particle size in the range from 12 to 200 nanometers.

15. An apparatus according to claim 6, wherein the brush cleaning tool is a doubled-sided roller brush cleaner containing one stage of brush cleaning.

16. An apparatus according to claim 1, wherein the final polished wafer achieves a smooth, bondable surface of less than 9 Angstroms RMS and is bonded to another handle wafer using bonding tools and techniques.

* * * * *